United States Patent
Lin et al.

(10) Patent No.: US 9,054,109 B2
(45) Date of Patent: Jun. 9, 2015

(54) CORROSION/ETCHING PROTECTION IN INTEGRATION CIRCUIT FABRICATIONS

(75) Inventors: Wei Lin, Albany, NY (US); Son Nguyen, Schenectady, NY (US); Vamsi Paruchuri, Clifton Park, NY (US); Tuan A. Vo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 13/482,352

(22) Filed: May 29, 2012

(65) Prior Publication Data

US 2013/0320544 A1 Dec. 5, 2013

(51) Int. Cl.
*H01L 23/532* (2006.01)
*H01L 21/768* (2006.01)

(52) U.S. Cl.
CPC ...... *H01L 23/53238* (2013.01); *H01L 23/5329* (2013.01); *H01L 23/53295* (2013.01); *H01L 21/76829* (2013.01); *H01L 21/76834* (2013.01); *H01L 2924/0002* (2013.01); *H01L 21/76888* (2013.01)

(58) Field of Classification Search
CPC ............... H01L 21/76829; H01L 21/76841; H01L 21/76855; H01L 21/76856; H01L 21/76883; H01L 21/76888; H01L 23/485; H01L 23/5226
USPC .......... 257/760, 750; 438/618, 624, 634, 636
See application file for complete search history.

(56) References Cited

U.S. PATENT DOCUMENTS

| | | | |
|---|---|---|---|
| 6,853,082 B1 | 2/2005 | Chen et al. | |
| 7,193,325 B2* | 3/2007 | Wu et al. | 257/760 |
| 7,727,882 B1* | 6/2010 | Wu et al. | 438/627 |
| 7,884,475 B2 | 2/2011 | Gambino et al. | |
| 7,932,176 B2* | 4/2011 | Gordon et al. | 438/627 |
| 8,035,230 B2* | 10/2011 | Arakawa | 257/774 |
| 8,134,234 B2* | 3/2012 | Isobayashi | 257/751 |
| 8,222,134 B2* | 7/2012 | Gordon et al. | 438/627 |
| 2003/0049929 A1 | 3/2003 | Tsuchiya | |
| 2005/0218519 A1* | 10/2005 | Koike et al. | 257/756 |
| 2006/0257675 A1* | 11/2006 | Chun et al. | 428/469 |
| 2010/0285660 A1 | 11/2010 | Lin et al. | |

(Continued)

OTHER PUBLICATIONS

KBM Affilips, http://www.kbmaffilips.com/copper-manganese_en.html, Jun. 2, 2013.*

(Continued)

*Primary Examiner* — David Zarneke
(74) *Attorney, Agent, or Firm* — Catherine Ivers (57) ABSTRACT

A method of producing reduced corrosion interconnect structures and structures thereby formed. A method of producing microelectronic interconnects having reduced corrosion begins with a damascene structure having a first dielectric and a first interconnect. A metal oxide layer is deposited selectively to metal or nonselective over the damascene structure and then thermally treated. The treatment converts the metal oxide over the first dielectric to a metal silicate while the metal oxide over the first interconnect remains as a self-aligned protective layer. When a subsequent dielectric stack is formed and patterned, the protective layer acts as an etch stop, oxidation barrier and ion bombardment protector. The protective layer is then removed from the patterned opening and a second interconnect formed. In a preferred embodiment the metal oxide is a manganese oxide and the metal silicate is a MnSiCOH, the interconnects are substantially copper and the dielectric contains ultra low-k.

22 Claims, 12 Drawing Sheets

(56) References Cited

U.S. PATENT DOCUMENTS

| | | | |
|---|---|---|---|
| 2011/0049718 A1* | 3/2011 | Matsumoto et al. | 257/751 |
| 2011/0163062 A1 | 7/2011 | Gordon et al. | |
| 2011/0180309 A1* | 7/2011 | Edelstein et al. | 174/257 |
| 2012/0061838 A1* | 3/2012 | Edelstein et al. | 257/751 |

OTHER PUBLICATIONS https://www.boundless.com/chemistry/metals/some-3d-transition-metals/titanium-chromium-and-manganese/, Sep. 20, 2013.*

R.G. Gordon, et al., Chemical vapor deposition (CVD) of manganese self-aligned diffusion barriers for Cu interconnections in microelectronics,: In Advanced Metallization Conference 2008 (AMC 2008): Proceedings of the conference: Sep. 23-25, 2008, San Diego, California, U.S.A. and Oct. 8-10, 2008, at the University of Tokyo, Tokyo, Japan. Materials Research Society conference proceedings. Warrendale, Pa: Materials Research Society.

J.M. Ablett, et al., "Phase Identification of Self-Forming Cu-Mn Based Diffusion Barriers on p-SiOC:H and SiO2 Dielectrics Using X-Ray Absorption FIne Structure," Appl. Phys. Lett. 94, 042112 (2009).

T-K Kang, et al., "Avoiding Cu Hillocks During the Plasma Process," J. of Electrochem. Soc., 151 (6) G391-G395 (2004).

K. Matsumoto, et al., "Deposition Behavior and Diffusion Barrier Property of CVD MnOx," IEEE International Interconnect Technology Conference, 2009, pp. 197-199.

V. K. Dixit, et al., "Structural and Electronic Properties of a Mn Oxide Diffusion Barrier Layer Formed by Chemical Vapor Deposition," IEEE Transactions on Device and Materials Reliability, vol. 11, No. 2, Jun. 2011, pp. 295-302.

K. Neishi, et al., "Formation of a Manganese Oxide Barrier layer with thermal Chemical Vapor Deposition for Advanced Large-Scale Integrated Interconnect Structure," Appl. Phys. Lett., 93, 032106 (2006).

S.-M. Chung, et al., "Analysis of Dielectric Constant of a Self-Forming Barrier Layer with Cu-Mn Alloy on TEOS-SiO2," J. Vac. Sci. Tech. B: Microelectronics and Nanometer Structures, vol. 27, No. 5, pp. L28-L31, 2009.

S. V. Nguyen, et al., "Substrate Trenching mechanism During Plasma and Magnetically enhanced Polysilicon Etching," J. Electrochem. Soc., vol. 138, No. 4, Apr. 1991, pp. 1112-1117.

D. K. Walanda, et al., "Kinetics of Mn2O3 Digestion in H2SO4 Solutions," Journal of Solid State Chemistry, 182 (2009) 1336-1342.

H. A. Le, et al., "Chemical Vapor Synthesis and Characterization of Manganese Oxides," Chem. Vap. Deposition, 2011, 17, pp. 228-234.

P. M. Fox et al., "The Kinetics of Iodide Oxidation by the Manganese Oxide Mineral Birnessite," Geochimica et Cosmochimica Acta 73 (2009) 2850-2861.

A.B. Pankratova, et al., "Dissolution Kinetics of Manganese (III, IV) Oxides in Sulfuric Acid in the Presense of Ethylenediaminetetraacetic Acid," Theoretical Foundations of Chemical Engineering, vol. 35, No. 2, 2001, pp. 168-174.

G. Furlani, et al., "Reductive Acid Leaching of Manganese Dioxide with Glucose: Identification of Oxidation Derivatives of Glucose," Hyrometallurgy 81 (2006) 234-240.

Chapter 21 of "Fundamentals of Metallic Corrosion: Atmospheric and Media Corrosion of Metals," 2006 by Taylor & Francis Group LLC, pp. 539-569.

DuPont CuSolve EKC 575 Technical Application Note, 2011.

Corrosion of Copper and Copper Alloys—Key to Metals Article—The World's Most Comprehensive Metals Database.—Article 16.

Thomas, James L.—Electrical-Resistance Alloys of Copper, Manganese, and Aluminum—U.S. Department of Commerce—Research Paper RP863—Part of Journal Research of the National Bureau of Standards, vol. 16, Feb. 1936.

* cited by examiner

CORROSION/ETCHING PROTECTION IN INTEGRATION CIRCUIT FABRICATIONS

FIELD OF THE INVENTION

The present invention generally relates to interconnects of microelectronic devices and method of making the interconnects. In particular, the invention relates to an improved method of forming interconnects to prevent detrimental corrosion or etching of the interconnect by forming a protective layer.

BACKGROUND AND RELATED ART

Figure 1:
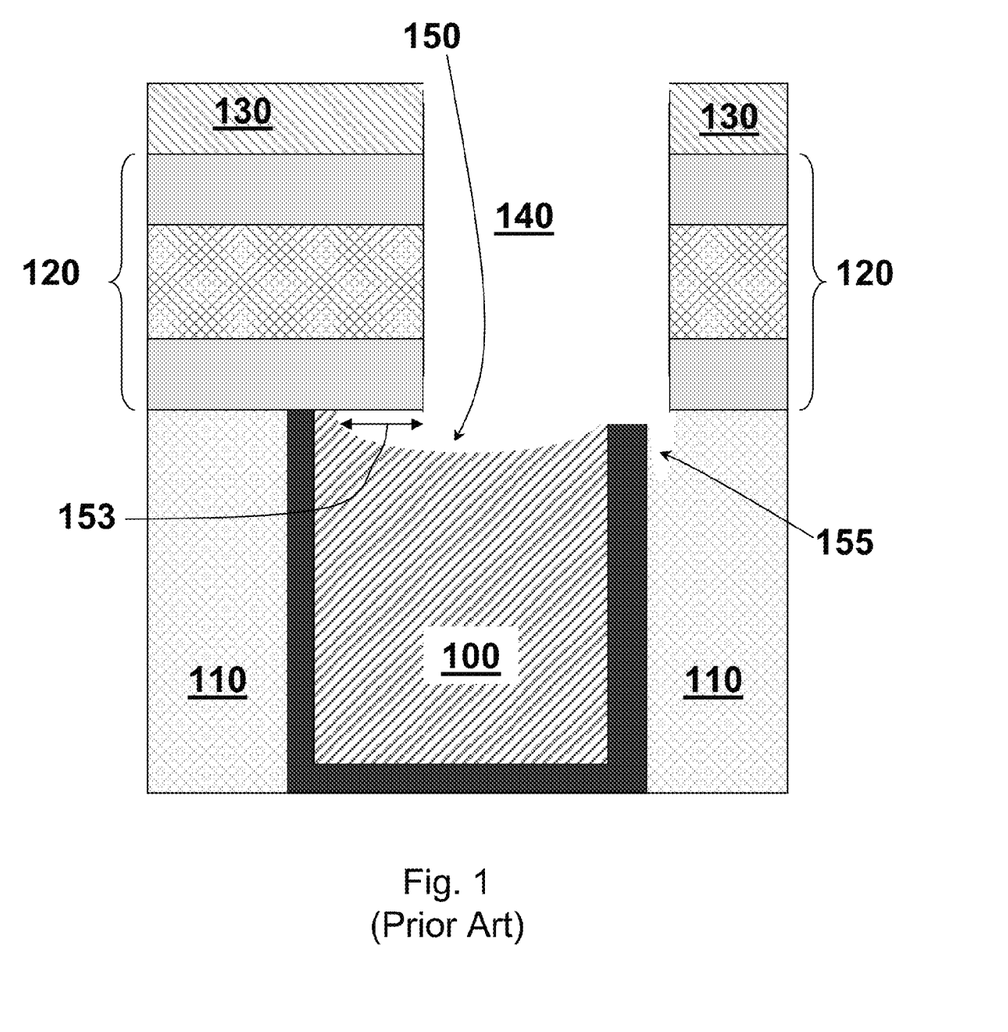
FIG. 1 illustrates a misaligned opening and corrosion and etching of an first interconnect and first dielectric as known in the art.

Integrated circuits of microelectronic devices include interconnects to wire together the devices, thus making the circuits. In a typical process for making the interconnects, a first interconnect 100 is embedded in first dielectric material 110 and covered by a stack of dielectric material 120. Above the dielectric stack 120 is a hard mask 130 to aid in forming an opening 140 in the dielectric stack 120 which reaches the first interconnect 100. After the opening 140 is formed, the hard mask 130 is removed with a wet etch which also corrodes/etches 150 a portion of the first interconnect 100. The corrosion/etching 150 of the first interconnect 100 may extend such that it undercuts 153 the dielectric stack 120. In addition, if the opening is misaligned (see FIG. 1), the etch of dielectric stack 120 to form opening 140, and/or hard mask removal wet etch can also over-etch 155 a portion of the first dielectric material 110. In either case, the corrosion/etching of the first interconnect, and the etching of the first dielectric material causes device reliability concerns. Thus, an improved method and structure for forming interconnects with minimal corrosion/over-etching is needed. The need is especially acute for copper-ultra low k interconnect wiring structures.

SUMMARY

The general principal of the present invention is a method of forming interconnects without corrosion by using a protective layer.

In one embodiment a method of forming an interconnect structure having reduced corrosion includes providing a first interconnect embedded in a first dielectric material; forming a protective layer over the first interconnect; forming a dielectric stack over the first interconnect and first dielectric material; forming a hard mask over the dielectric stack; forming an opening in the hard mask and the dielectric stack over the first interconnect; removing the protective layer in the opening; and forming a second interconnect.

In another aspect, an interconnect structure having reduced corrosion includes a first interconnect in a first dielectric, and first insulator portion having a metal silicate layer above the first dielectric.

In a further aspect, an interconnect structure having reduced corrosion includes a first interconnect in a first dielectric, and first insulator portion having a metal silicate layer above the first dielectric. In addition, there is first conductor portion having a protective layer above the first interconnect.

In still another aspect, an interconnect structure having reduced corrosion includes a first interconnect in a first dielectric, and first insulator portion having a metal silicate layer above the first dielectric. In addition, there is first conductor portion having a protective layer above a portion of the first interconnect. While, above a second portion of the first interconnect, there is a second interconnect.

In yet another aspect, an interconnect structure having reduced corrosion includes an insulator stack portion; a first conductive portion; and a second conductive portion. The insulator stack portion comprises a dielectric stack above a metal silicate layer wherein the metal silicate layer is above a first dielectric. The first conductive portion comprises a dielectric stack above a protective layer wherein the protective layer is above a portion of a first interconnect. The second conductive portion comprises a second interconnect above the first interconnect.

BRIEF DESCRIPTION OF THE DRAWINGS

Other objects, aspects and advantages of the invention will become obvious in combination with the description of accompanying drawings, wherein the same number represents the same or similar parts in all figures.

DETAILED DESCRIPTION

Embodiments of methods for making a reduced corrosion interconnect structure are described in conjunction with FIGS. 2-8b. An embodiment of interconnect structure with reduced corrosion is described in conjunction with FIGS. 8a-9b. Embodiments in which the first interconnect 110 is not recessed are described in "a" figures and embodiments in which the first interconnect 110 has a recess are described in "b" figures.

Figure 2:
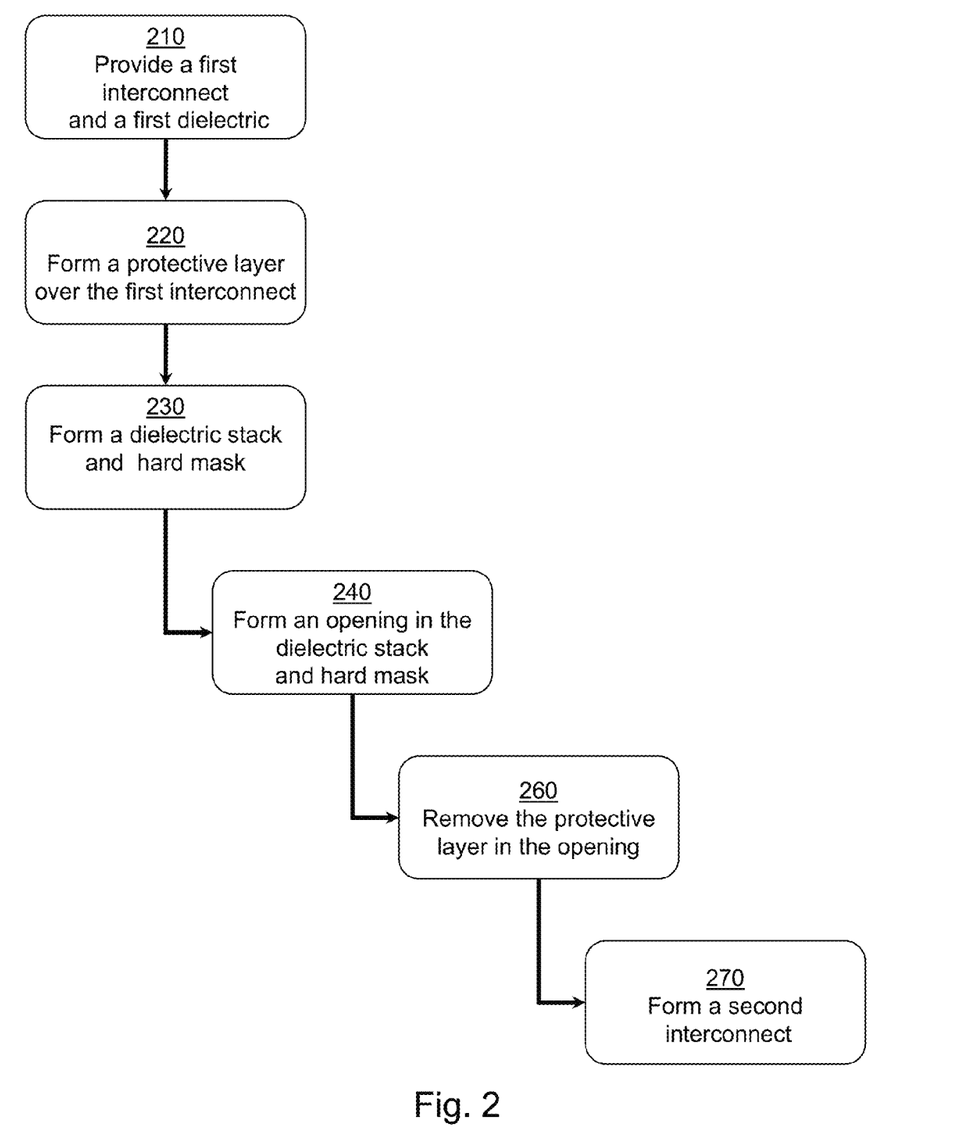
FIG. 2 is a flow chart for making a reduced corrosion structure of the present invention according to a method embodiment of the present invention.

Referring to FIG. 2, a method for making a reduced corrosion interconnect is shown. The method starts at 210 by providing a first interconnect and a first dielectric which are, preferably, substantially co-planar. In other embodiments, the first interconnect may be recessed with respect to the top surface of the first dielectric. At 220 a protective layer is formed over the first interconnect. In a preferred embodiment, while the protective layer is formed over the first interconnect, a metal silicate layer is simultaneously formed over the first dielectric. In another embodiment, the protective layer is formed over the first interconnect only. At 230 a dielectric stack and hard mask are formed over the first dielectric and first interconnect. At 240 an opening is formed in the hard mask and dielectric stack; the opening being at least partially over the first interconnect. At 260 the protective layer in the opening is removed. At 270 a second interconnect is formed. A more detailed description of the method steps is given in conjunction with FIGS. 3a-7b.

Figure 3A:
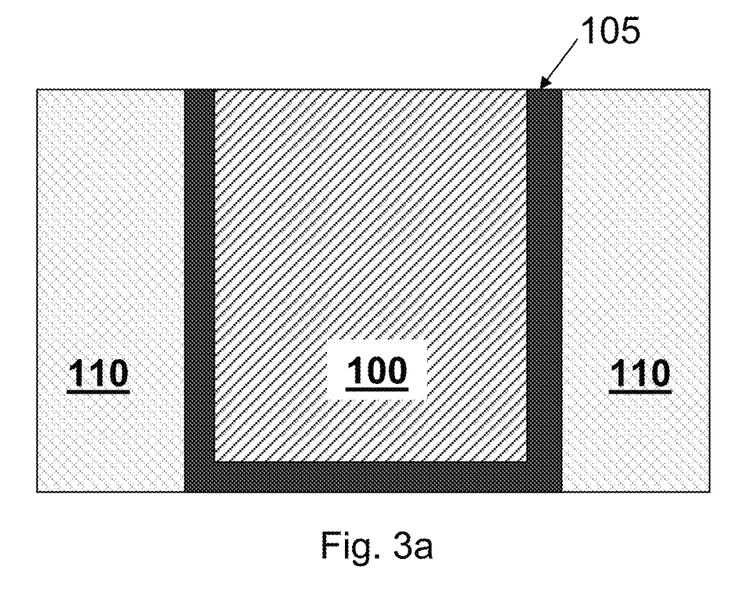
FIG. 3a illustrates a first interconnect embedded in a first dielectric according to an embodiment of a step in the method of the present invention.
Figure 3B:
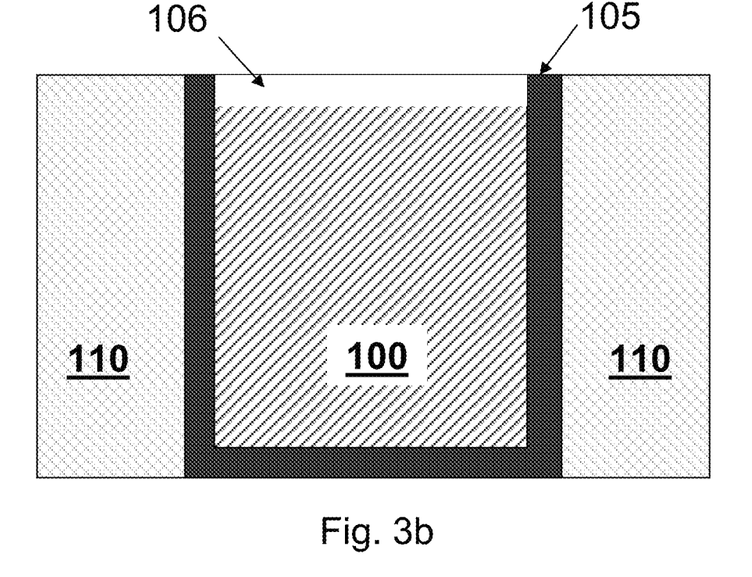
FIG. 3b illustrates a first interconnect having a recess embedded in a first dielectric according to another embodiment of a step in the method of the present invention.

Referring to FIG. 3a, a first interconnect 100 which is substantially co-planar with a first dielectric 110 is illustrated. The first interconnect can be surrounded by a liner layer 105 located at between the first interconnect 100 and the first dielectric 110. FIG. 3a shows a damascene structure in which the first interconnect 100 is embedded in the first dielectric 110. Referring to FIG. 3b, an alternative embodiment in which a first interconnect 100 with a recess 106 is illustrated. In either embodiment, the first interconnect can be surrounded by a liner layer 105 and is embedded in the first dielectric 110.

A first dielectric 110 can be one or more insulating layers. In a preferred embodiment, at least a portion of the first dielectric is a low dielectric constant film. By way of example, and not limitation, low dielectric constant films include those with a dielectric constant less than about 3.9 and preferably less than about 3. By way of further example, and not limitation, a low dielectric constant film includes doped oxides and in a preferred embodiment is SiCOH. An ultra low dielectric constant film (also referred to as an ultra low-k film) has a dielectric constant less than about 3 and preferably less than 2.6. By way of further example, and not limitation, a porous SiCOH film (herein "p-SiCOH") is an example of an ultra low-k film.

A first interconnect 100 is a conductive film. In a preferred embodiment the conductive film substantially contains copper. A liner 105 is a conductive material or preferably materials that both promote adhesion and prevent migration among the first interconnect 100 and first dielectric 110. By way of example, and not limitation, the liner 105 can contain at least one of Ta, TaN, Mn and MnOx.

Figure 4A:
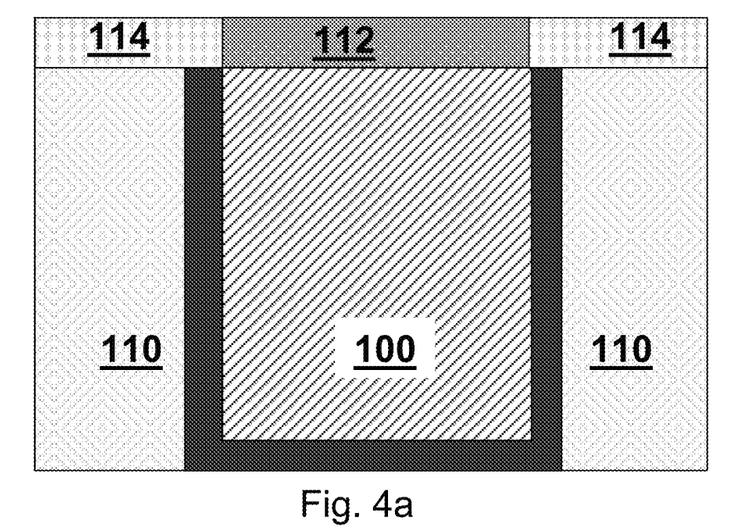
FIG. 4a illustrates a self-aligned protective layer and metal silicate above a damascene structure according to a step in the method of the present invention.

Referring to FIG. 4a, a protective layer is formed over and in contact with the first interconnect 100. The protective layer 112 can be formed in a variety of ways. In a first way the protective can be deposited chemical vapor deposition (CVD). Here, the protective layer is deposited as a metal oxide over the first dielectric, liner and first interconnect; then it is annealed. During the anneal the metal oxide remains over the first interconnect 110 to keep the protective layer 112 intact over the first interconnect, but reacts with the first dielectric 100 to form a metal silicate 114. It is also possible, that some of the metal of the metal oxide forms an interface between the first interconnect and metal oxide. In a second way, metal is deposited by physical vapor deposition (PVD) or CVD over the first interconnect liner and first dielectric. Then there is an anneal in an oxidizing environment which converts at least a portion of the metal over the first interconnect to a protective layer 112 (metal oxide). The anneal converts the portion of the metal over the first dielectric to a metal silicate 114. The anneal can be from about 150 degrees Celsius to about 500 degrees Celsius and ranges therebetween. The annealing time can be from about 0 minutes to about 4 hours and ranges therebetween. In a third way, a metal is deposited by physical vapor deposition (PVD) or CVD over the first interconnect, liner and first dielectric and then a metal oxide is formed by CVD. In this way, the protective layer over the first interconnect is a metal/metal oxide layer and a metal silicate is over the first dielectric. Other variations are also possible.

In a preferred embodiment, protective layer 112 is a metal oxide film such as manganese oxide, cobalt oxide, tantalum oxide, aluminum oxide, titanium oxide, nickel oxide, chromium oxide, etc., in their stoichiometric or nonstoichiometric forms, and combinations thereof. In a preferred embodiment, protective layer 112 is a manganese oxide film (for example, $MnO$, $Mn_3O_4$, $Mn_2O_3$, $MnO_2$, $Mn_2O_7$ or others) deposited by chemical vapor deposition. In another embodiment, protective layer 112 can be a composite metal/metal oxide film such as manganese/manganese oxide, Tantalum/Tantalum oxide, Aluminum/Aluminum oxide, cobalt/cobalt oxide, titanium/titanium oxide, nickel/nickel oxide, chromium/chromium oxide, etc., and more preferably, a manganese/manganese oxide film (for example, $Mn/MnO$, $Mn/Mn_3O_4$, $Mn/Mn_2O_3$, $Mn/MnO_2$, $Mn/Mn_2O_7$ or others).

Still referring to FIG. 4a, metal silicate layer 114 is not necessarily stoichiometric or of a single compound/composition. Preferably, the metal silicate layer also includes carbon. In a preferred embodiment the metal silicate layer is $MnSiC_xO_yH_z$.

Figure 4B:
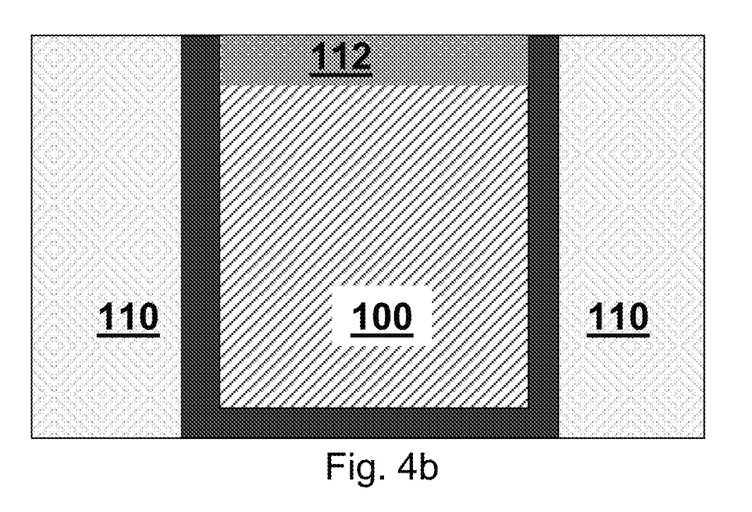
FIG. 4b illustrates a protective layer within a recess of a first interconnect according to another embodiment of a step in the method of the present invention.

Preferably, the protective layer 112 (i.e. metal oxide) is not over the liner 105 as seen in FIGS. 4a and 4b, however, the protective layer 112 could also be over the liner 105. In FIG. 4a the protective layer 112 and metal silicate 114 are shown to be substantially co-planar. In other embodiments, not shown, the metal silicate layer 114 is thinner than the protective layer 112 such that a top surface of the metal silicate 114 is below the top surface of the protective layer 112. The protective layer 112 is from about 1 nm to about 20 nm thick and ranges therebetween. The metal silicate 114 is from about 0 nm to about 20 nm thick and ranges therebetween.

Referring to FIG. 4b, a recessed first interconnect embodiment is shown after a protective layer 112 is formed selectively over the recessed first interconnect 100. In this embodiment, protective layer 112 can be co-planar with the first dielectric 110 by deposition control of protective layer 112 or/and post-deposition planarization such as etching or chemical mechanical polishing. Here, the protective layer 112 is in contact with liner 105 on either side rather than with metal silicate 114 as was the case in FIG. 4a which illustrated the non-recessed embodiment.

Figure 5A:
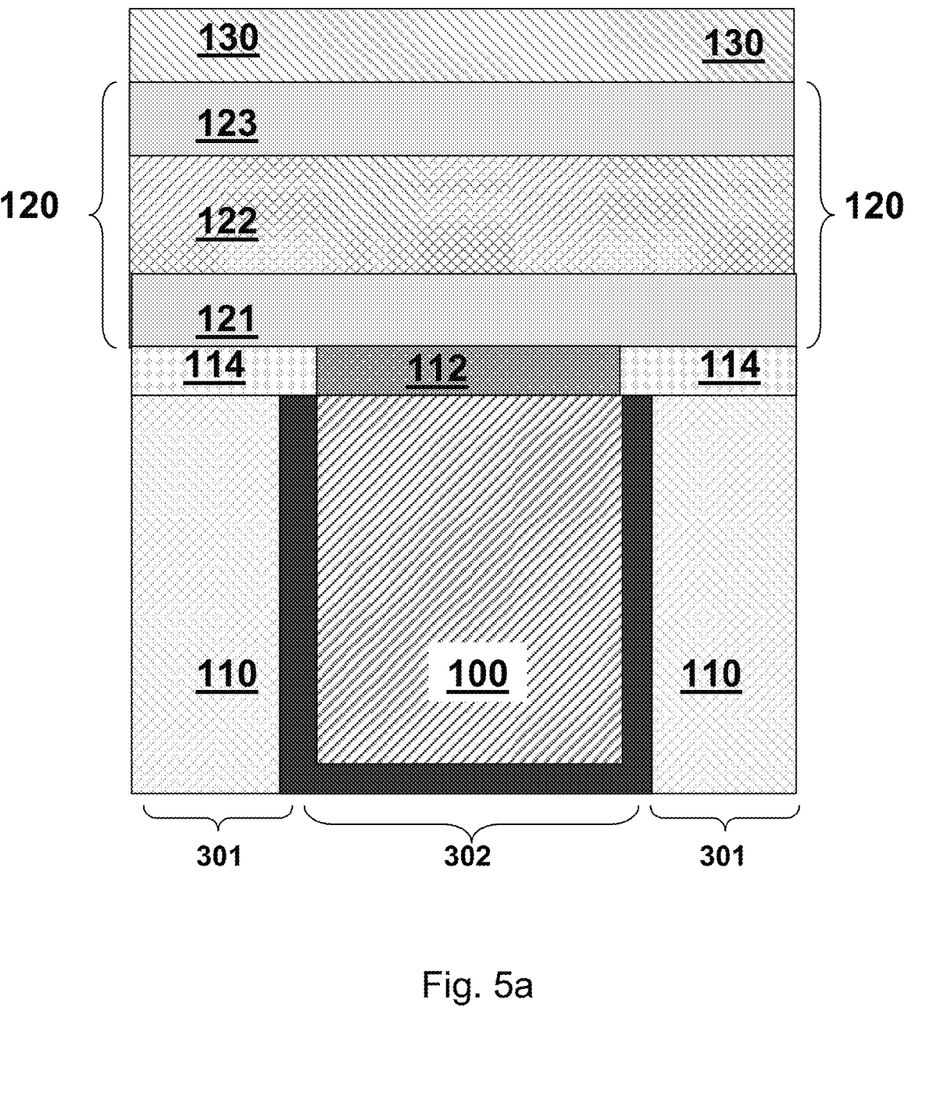
FIG. 5a illustrates a dielectric stack and hard mask above a damascene structure according to a step in the method of the present invention.

Referring to FIG. 5a, a dielectric stack 120 is formed over the first interconnect and first dielectric, thus the dielectric stack 120 is above the protective layer 112 and metal silicate 114. The dielectric stack can include one or more layers of dielectric material. In the preferred embodiment of a dielectric stack 120 shown in FIG. 5a, the dielectric stack 120 has three layers: a lower barrier layer 121, a bulk layer 122 and a top layer 123. The lower barrier layer 121 includes nitrogen, and in a preferred embodiment also includes carbon. An example lower barrier is SiCN. In a preferred embodiment, the lower barrier 121 can be from about 10 nm to about 25 nm and ranges therebetween. The bulk layer 122 is preferably a low dielectric constant material such as those described in conjunction with reference numeral 110. In a preferred embodiment, the bulk layer 122 is SiCOH or p-SiCOH. In a preferred embodiment, the bulk layer 122 can be from about 100 nm to about 200 nm thick and ranges therebetween. The top layer 123 is an insulating film which has a higher dielectric constant than bulk layer 122. In a preferred embodiment, top layer 123 is $SiO_2$. In a preferred embodiment, top layer 123 is from about 15 nm.

Still referring to FIG. 5a, a hard mask 130 is above the dielectric stack 130. In a preferred embodiment, hard mask 130 is TiN and is about 25 nm thick.

Figure 5B:
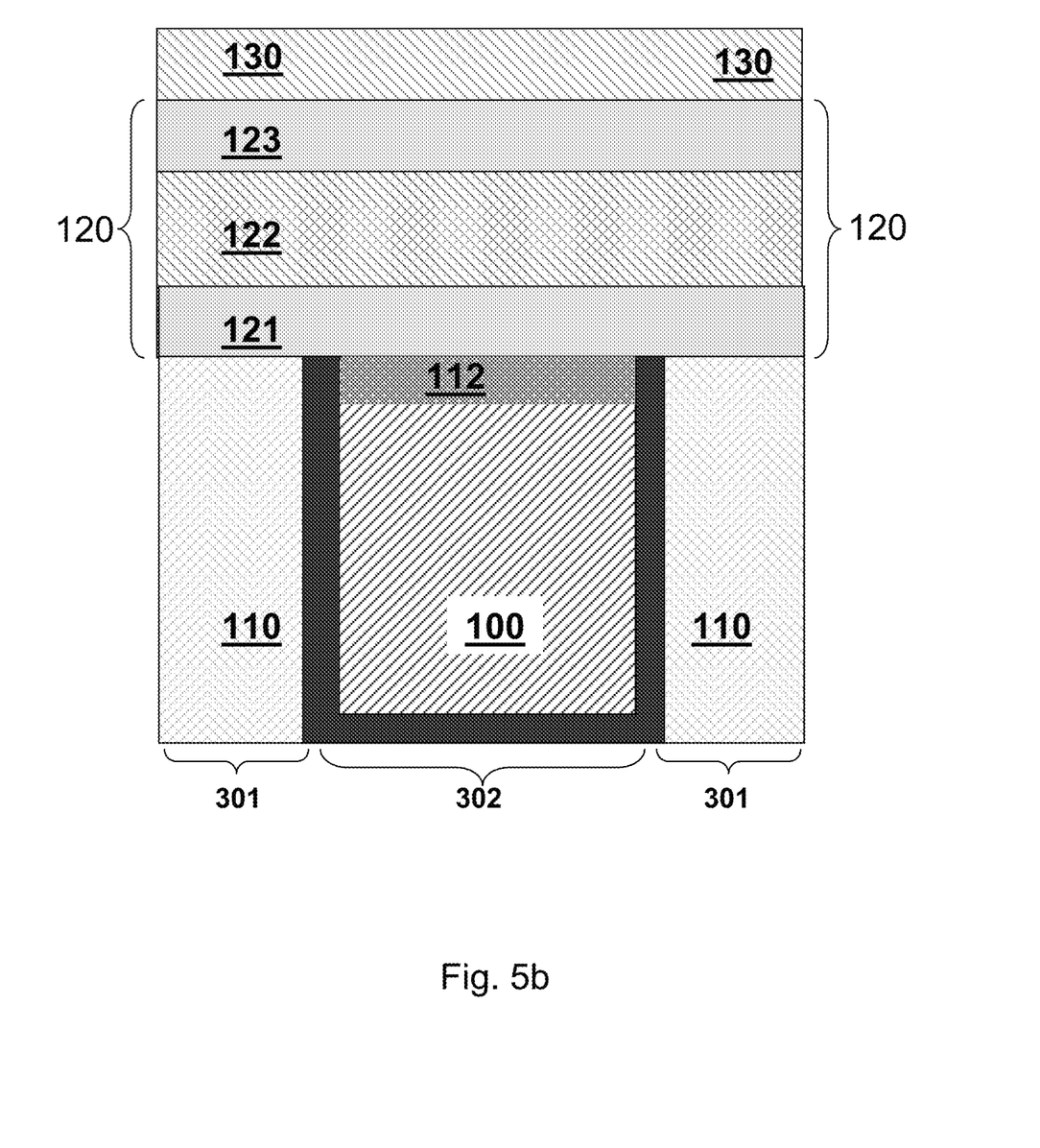
FIG. 5b illustrates a dielectric stack and hard mask in an embodiment having a recessed interconnect according to a step in the method of the present invention.

Referring to FIG. 5b, a dielectric stack 120 and hard mask 130 is shown for the embodiment in which the protective layer 112 is formed in a recessed first interconnect 100. In this embodiment, because there is no metal silicate 114 over the first dielectric 110, the dielectric stack 120 is in contact with the first dielectric 110.

Figure 6A:
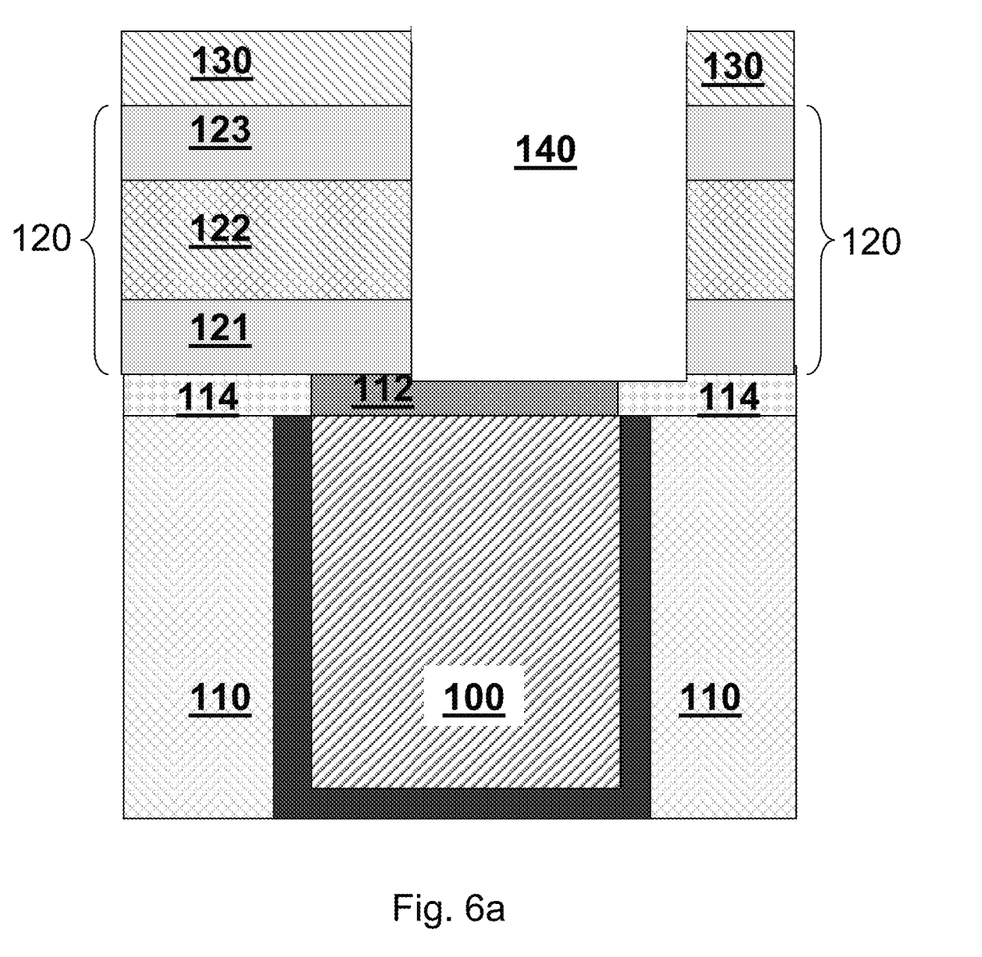
FIG. 6a illustrates an opening in the dielectric stack according to a step in the method of the present invention.

Referring to FIG. 6a, an opening 140 is formed in the hard mask 130 and in the dielectric stack 120. The opening 140 can be about 20 nm wide, but those skilled in the art will recognized that the width will vary from technology node to node and from level to level within the integrated circuit. In a preferred embodiment, the opening 140 is formed by reactive ion etching (herein "RIE") using a fluorocarbon based chemistry. During etch, the protective layer 112 acts as an etch stop layer. The high selectivity of the dielectric stack RIE to the protective layer 112 and the hardness of the metal oxide protective layer 112 shields the first interconnect 100 from both oxidation and ion bombardment. The same is true for FIG. 6b which illustrates an opening 140 formed in the dielectric stack 120 of an embodiment having a recessed first interconnect 100.

Figure 6B:
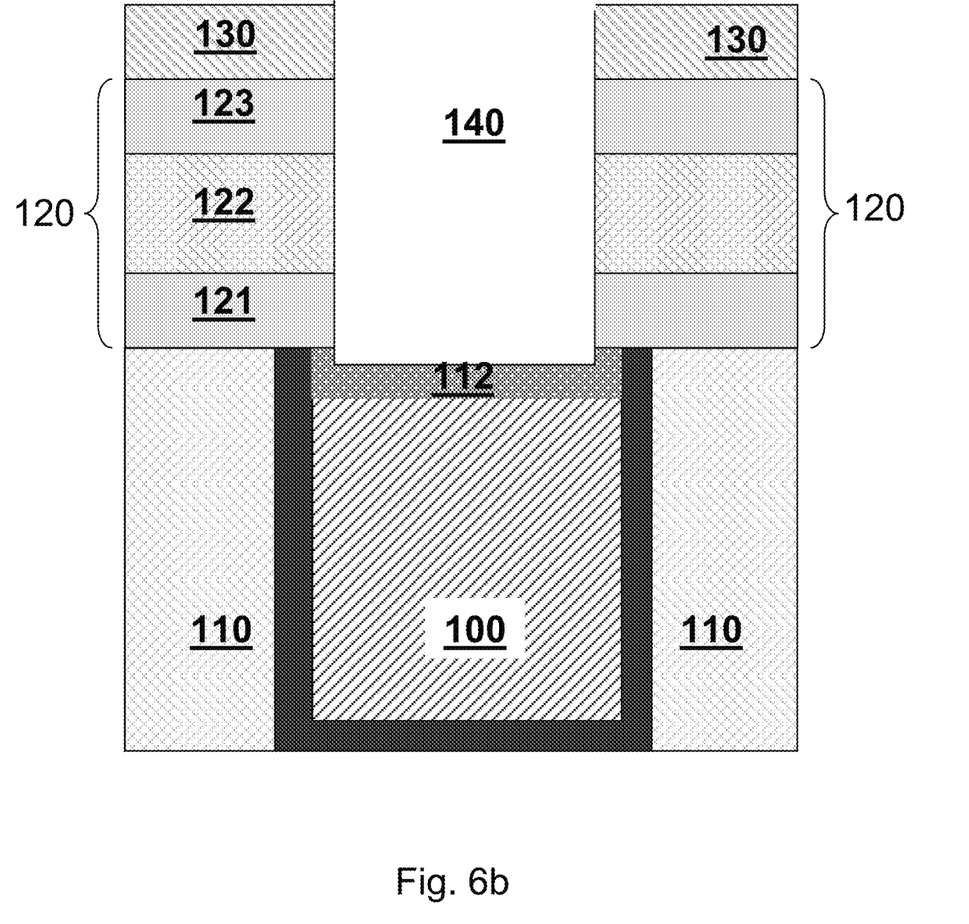
FIG. 6b illustrates an opening in the dielectric stack in an embodiment having a recessed interconnect according to a step in the method of the present invention.

Returning to FIG. 6a, the opening 140 is misaligned, meaning part of the opening is over the first interconnect 100 while another part of the opening is over the first dielectric 110. Preferably, the opening 140 would be aligned so that it is fully over the first interconnect 100. FIG. 6b shows an example of an aligned opening.

Figure 7A:
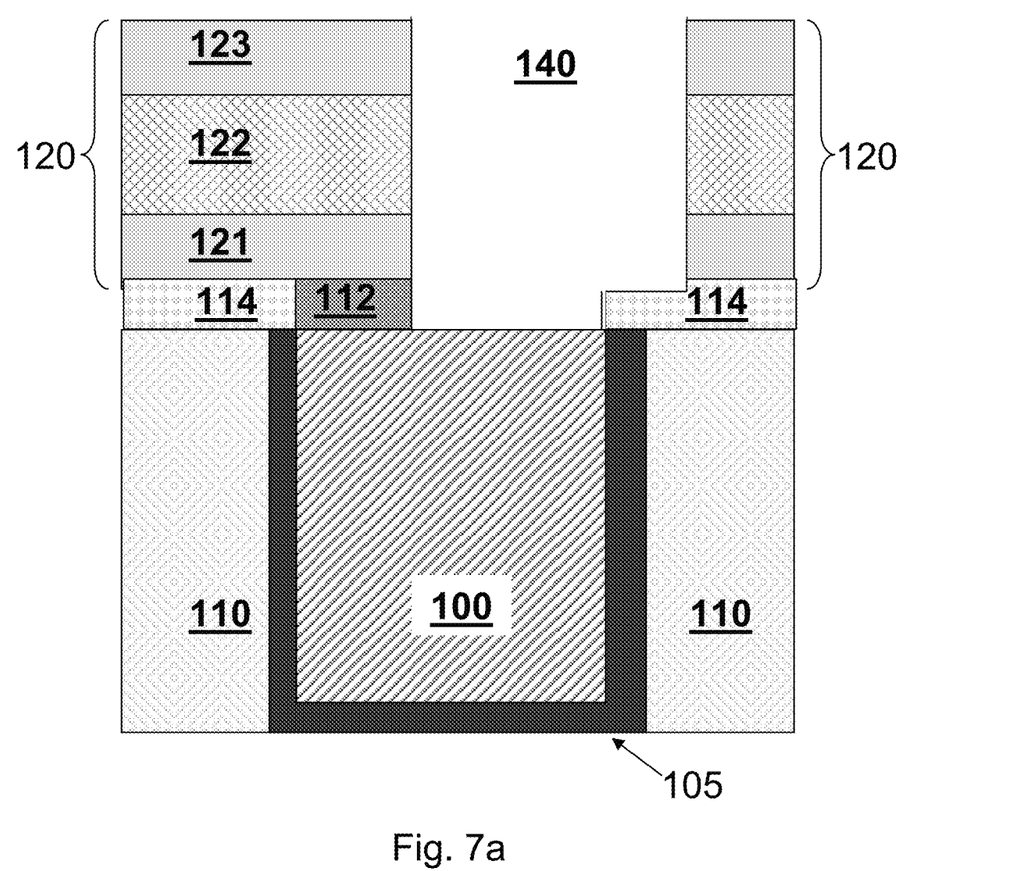
FIG. 7a illustrates removal of the protective layer in the opening according to a step in the method of the present invention.

Referring to FIG. 7a, the hard mask 130 is removed. Furthermore, the protective layer 112 in the opening 140 is removed to expose the top surface of the first interconnect 100 for areas under the opening 140. In areas of the first interconnect 100 not under the opening 140, the protective layer 112 remains, though it may be slightly horizontally recessed to undercut the dielectric stack 120. The metal silicate 114, however, largely remains regardless if it is under the opening or not under the opening 140.

Figure 7B:
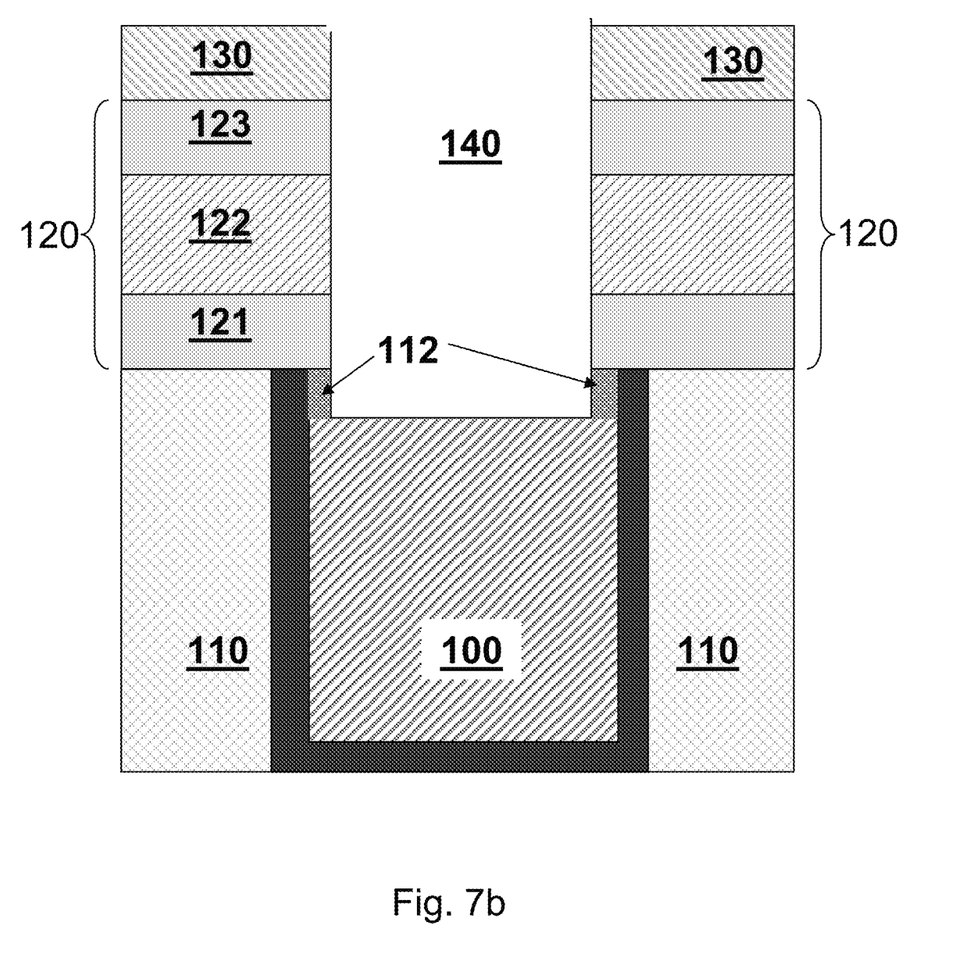
FIG. 7b illustrate removal of the protective layer in the opening in an embodiment having a recessed interconnect according to a step in the method of the present invention.

Referring to FIG. 7b, hard mask 130 removal and protective layer 112 removal is shown in an embodiment having a recessed first interconnect. Again, in areas of the first interconnect 100 not under the opening 140, the protective layer 112 remains, though it may be slightly horizontally recessed to undercut the dielectric stack 120.

To achieve the structure shown in FIGS. 7a and 7b, a first dilute HF wet cleaning is used to remove any residual from the RIE of the dielectric stack 120. Then the hard mask 130 is removed using a chemical that is does not dissolve the protective layer 112. One example of such a chemical can be a base and hydrogen peroxide solution having a pH of about 9. Finally, the protective layer 112 is removed using ion bombardment (sputtering) or/and, as example, one of the following wet etch recipes: (1) 10 mM EDTA (ethylenediaminetetraacetic acid) at 50-80° C. and dilute $H_2SO_4$; (2) 30 g/L oxalic acid ($H_2C_2O_4$) at 50-80° C. and dilute $H_2SO_4$; (3) 1 mM ascorbic acid at 30-40° C. and dilute $H_2SO_4$; (4) 10 mM 2-propenol ($CH_2=CHCH_2OH$) 50-80° C., ethyl ether ($C_4H_{10}O$) and dilute $H_2SO_4$; and (5) $KI/I_2$ at 30-50° C., and dilute $H_2SO_4$. The preceding recipes are advantages in that metal oxides, such as manganese oxides used as the protective layer 112, are dissolvable in dilute $H_2SO_4$ in the absence of strong oxidizing agents. The organic chemicals in the recipes are "reducing agents" rather the "oxidative." Thus, they keep the first interconnect (preferably copper) intact but reduce Mn(IV)O to Mn(II)O (i.e. reduce $MnO_2$ to MnO or to $Mn_3O_4$) which then can be dissolved in dilute $H_2SO_4$. Meanwhile, the liner 105 is inert to the recipes not only due to the "reducing" conditions of the preceding recipes but also due to passivation of the liner.

Thus, in summary, the structures in FIGS. 7a and 7b can be achieved because (1) the protective layer 112 is an etch stop in view of the RIE chemistry used in dielectric stack 120 etch; and because (2) the protective layer 112 etches in a reducing condition whereas the first interconnect etching and the hard mask etching require oxidizing agents. Therefore, the protective layer 112 protects the first interconnect during RIE and removal of the hard mask 130 after RIE but thereafter can be selectively removed with respect to the first interconnect via a reducing wet etch.

Figure 8A:
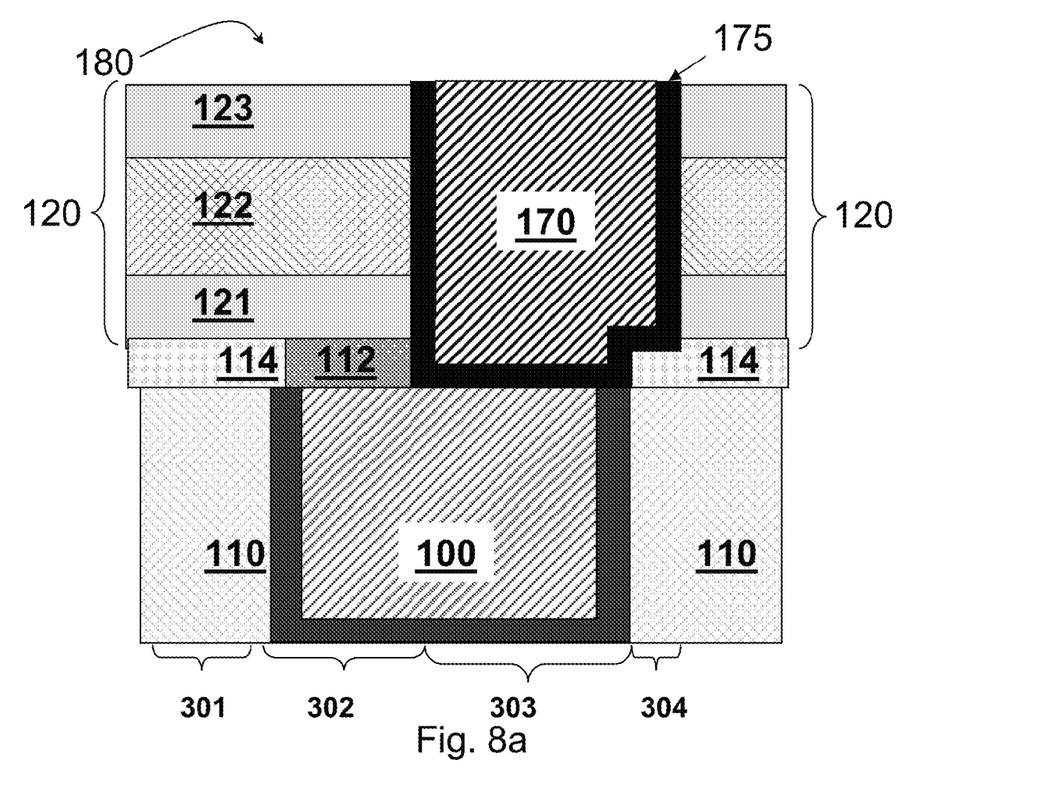
FIG. 8a illustrates an interconnect structure having reduced corrosion according to an embodiment of the present invention.
Figure 8B:
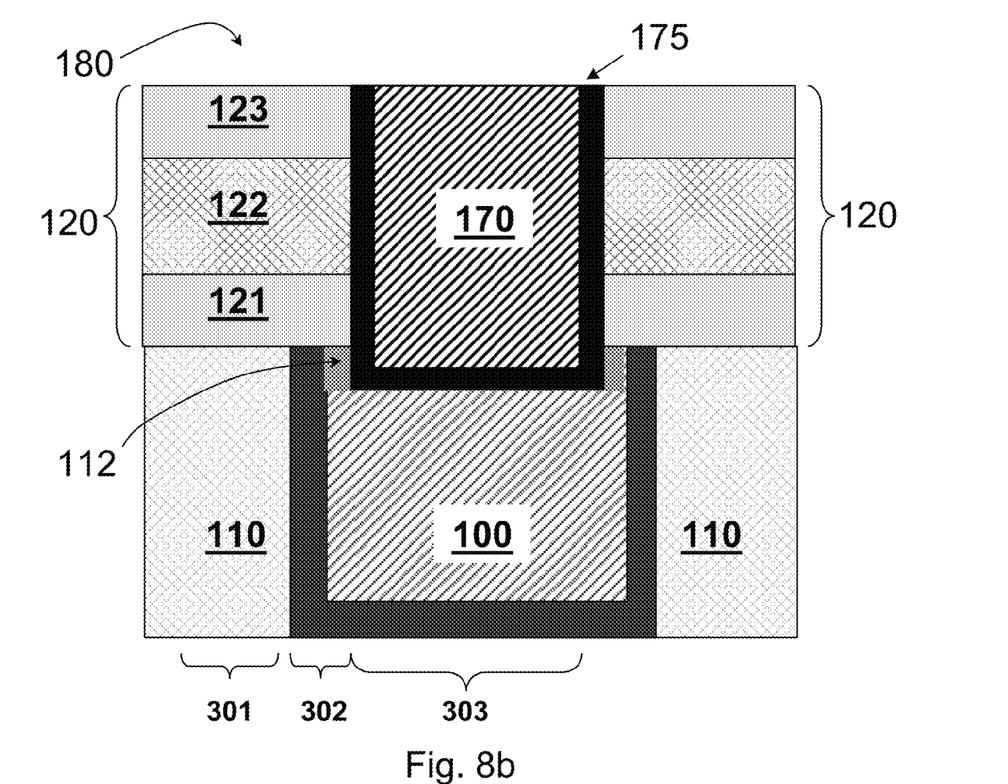
FIG. 8b illustrates an interconnect structure having reduced corrosion in an embodiment having a recessed interconnect according to an embodiment of the present invention.

Referring to FIGS. 8a and 8b, a second interconnect 170 with second liner 175 is formed by conventional means above and in communication with the first interconnect 100 to thereby form an interconnect structure 180 having reduced corrosion. The materials used in the second interconnect 170 and second liner 175 are the same as those described for the first interconnect 100 and liner 105.

Still referring to FIGS. 8a and 8b, further features of the interconnect structure 180 having reduced corrosion will be identified. First, there is an insulator stack portion 301. The insulator stack portion 301 is the vertical area of FIGS. 8a and 8b in which there is no conductive material. Thus, for the embodiment of FIG. 8a, the insulator stack portion 301 includes from bottom up, first dielectric 110, metal silicate 114, and dielectric stack 120. For the embodiment of FIG. 8b, the insulator stack portion 301 includes from bottom up, first dielectric 110, and dielectric stack 120. For both FIGS. 8a and 8b, dielectric stack 120 further includes three layers previously described.

Referring again to FIGS. 8a and 8b and moving to the right of insulator stack portion 301, there is first conductor stack portion 302. First conductor stack portion 302 is the vertical area of FIGS. 8a and 8b in which there is a first interconnect, but no second interconnect over it. Thus, the first conductor stack portion 302 includes from bottom up, first interconnect 100, protective layer 112 and dielectric stack 120. A first conductor stack portion 302 occurs when at least one sidewall of the second interconnect 170 and its liner 175 is aligned so as to be within the width of the first interconnect.

Still moving to the right in FIGS. 8a and 8b, there is second conductor stack portion 303. Second conductor stack portion 303 is the vertical area of FIGS. 8a and 8b in which there is a first interconnect and a second interconnect over it. Thus, the second conductor stack portion 303 includes from bottom up, first interconnect 100 and second interconnect 170.

Continuing to move to the right in FIG. 8a, there is offset area portion 304. Offset area portion 304 is the vertical area of FIG. 8a in which there is a first dielectric 110 and a second interconnect over it. Thus, the offset area portion 304 includes from bottom up, first dielectric 110, metal silicate 114, second liner 175 and optionally second interconnect 170. The offset area portion 304 occurs in embodiments in which the opening 140 was misaligned making the second interconnect 170 partially landed on the first interconnect 100. The misalignment and resulting partial landing creates offset area portion 304. Not all embodiments will have an offset area portion 304. For instance, if the opening 140 was not misaligned and the second interconnect 170 is fully landed, then there is no offset area portion 304. Furthermore, in embodiments in which the width of second interconnect 170 is at least as large as the first interconnect, then there may be no first conductor area portion 302.

Figure 9A:
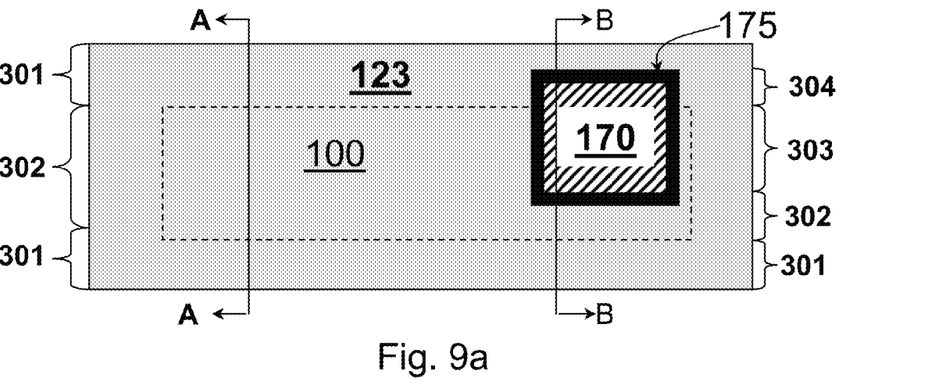
FIG. 9a illustrates a top down view of an interconnect structure of FIG. 8a according to an embodiment of the present invention.

Referring to FIG. 9a, a top down view of an interconnect structure 180 having reduced corrosion is shown, namely a top down view of FIG. 8a. Here, the second interconnect 170 and second liner 175 are shown embedded in the dielectric stack 120, and in particular, top layer 123 of the dielectric stack 120. The dotted line represents the first conductor 100 underneath the dielectric stack 120 and the second interconnect 170. The arrows B-B indicate a cross-section area discussed in conjunction with FIG. 8a. To the right, the portions of the interconnect structure 301, 302, 303 and 304 which were discussed in conjunction with FIG. 8a are indicated. Analogous features are also relevant to FIG. 9b which is a top down view of the structure of FIG. 8b.

Figure 9B:
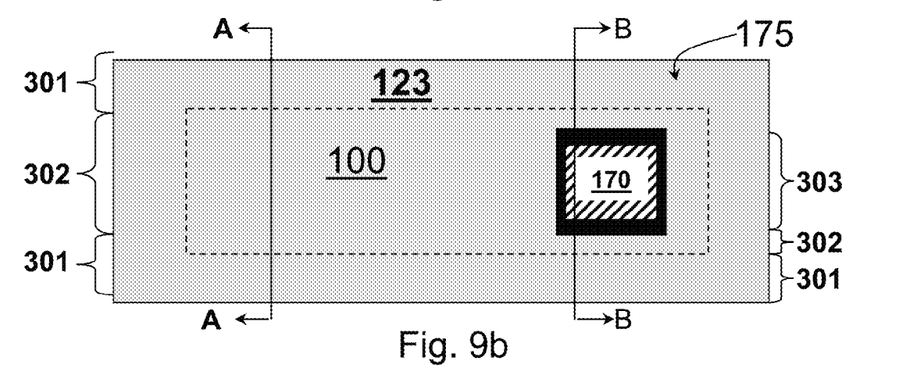
FIG. 9b illustrates a top down view of an interconnect structure of FIG. 8b according to an embodiment of the present invention.

Referring to FIGS. 9a and 9b and looking to the left, the arrows A-A indicate a cross-section area that will be discussed in conjunction with FIGS. 5a and 5b. Here, the A-A section appears the same as FIGS. 5a and 5b, except that the hardmask of FIGS. 5a and 5b is not present in the A-A structure. Because there is no second interconnect 170 in the A-A cross-section, there are on two vertical portions, 301 and 302. Referring to FIGS. 5a and 5b, the insulator stack portion 301 is on either side of the first interconnect. The materials are the same as those described in conjunction with FIGS. 8a and 8b. Referring to FIGS. 5a and 5b, the first conductor portion 302 is as described in conjunction with FIGS. 8a and 8b.

Returning to FIGS. 8a and 8b, the protective layer 112 in the first conductor portion 302 is further described. In the embodiment shown in FIGS. 8a and 8b, the protective layer is adjacent the sidewall of the second interconnect 170 and is under and in contact with the dielectric stack 120, in particular barrier layer 121. In addition, the protective layer is above a portion of the first interconnect 100. In FIGS. 8a and 8b, the protective layer 112 is flush with the dielectric stack 120 above it. However, as described earlier, it is possible that the protective layer is recessed horizontally to slightly undercut dielectric stack 120. In such an embodiment, which is not illustrated, the dielectric stack 120 slightly overhangs protective layer 112.

Still referring to FIG. 8a, the metal silicate layer in the offset area portion 304 is further described. In the embodiment shown in FIG. 8a, the metal silicate 114 is adjacent the sidewall of the second interconnect 170 on two sides, meaning the top and a side of metal silicate layer 114 is adjacent the second interconnect 170 and contacting the second liner 175. In contrast, the metal silicate 114 in the first insulator portion 301 does not contact the second interconnect 170, at most it may contact the first interconnect.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation as to encompass all such modifications and equivalent structures and functions.

We claim:

1. A method of inhibiting corrosion when forming an interconnect structure having first and second interconnects, the method comprising:
    providing a first interconnect embedded in a first dielectric material;
    forming a metal oxide protective layer over the first interconnect;
    forming a dielectric stack over the first interconnect and first dielectric material;
    forming a hard mask over the dielectric stack;
    forming an opening in the hard mask and the dielectric stack at least partially over the first interconnect wherein the metal oxide protective layer is capable of resisting corrosion in an oxidative environment;
    removing the hard mask while leaving the metal oxide protective layer to prevent corrosion of the first interconnect;
    removing the metal oxide protective layer in the opening without corroding the first interconnect; and
    forming a second interconnect.

2. The method of claim 1 wherein the metal oxide protective layer is formed selectively.

3. The method of claim 1 wherein the metal oxide protective layer comprises a manganese oxide.

4. The method of claim 1, further comprising forming a manganese silicate layer over the first dielectric.

5. The method of claim 4 wherein the forming the manganese silicate layer and the protective layer occurs simultaneously.

6. The method of claim 5 wherein the forming the manganese silicate layer and the metal oxide layer occurs by chemical vapor deposition of a manganese oxide.

7. The method of claim 5 wherein forming the manganese silicate layer and the metal oxide layer occurs by deposition of manganese and post deposition annealing in oxidized ambient.

8. The method of claim 4 wherein the manganese silicate layer includes carbon.

9. The method of claim 1 wherein the hard mask is a metal hard mask.

10. The method of claim 1 wherein forming an opening in the hard mask and the dielectric stack over the first interconnect includes metal oxide protective layer acting as an etch stop.

11. The method of claim 10 wherein forming an opening in the hard mask and the dielectric stack comprises using an oxidative agent and wherein removing the metal oxide protective layer in the opening comprises using a reducing agent.

12. An interconnect structure having reduced corrosion comprising:
    a first interconnect in a first dielectric;
    a first insulator portion having a metal silicate layer above the first dielectric;
    a metal oxide protective layer above and in contact with a portion of the first interconnect; and
    a second interconnect having a second liner above another portion of the first interconnect;
    wherein the metal oxide protective layer does not line the second interconnect,
    wherein the second liner is in contact with the another portion of first interconnect, and
    wherein the portion of the first interconnect does not overlap with the another portion of the first interconnect.

13. The structure of claim 12 wherein the first insulator portion further includes a dielectric stack above the metal silicate layer.

14. The structure of claim 12 wherein the metal silicate layer includes manganese.

15. The structure of claim 14 wherein the metal silicate layer further includes carbon.

16. The structure of claim 12 wherein the metal oxide contains manganese.

17. The structure of claim 13 further comprising a dielectric stack above the protective layer.

18. The structure of claim 12 wherein the metal oxide protective layer is in contact with a sidewall of the second interconnect.

19. The structure of claim 18 wherein a dielectric stack is above and in contact with the metal oxide protective layer and overhangs the metal oxide protective layer.

20. An interconnect structure having reduced corrosion comprising:
    an insulator stack portion;
    a first conductive stack portion; and
    a second conductive stack portion;
    wherein the insulator stack portion comprises a dielectric stack above a first dielectric;
    wherein the first conductive stack portion comprises the dielectric stack above a protective layer wherein the protective layer is above a first portion of a first interconnect but is not present above the first dielectric in the insulator stack portion; and
    wherein the second conductive stack portion comprises a second interconnect above a second portion of the first interconnect.

21. The structure of claim 20,
    wherein the first and second interconnects comprise copper;
    wherein the protective layer comprises a metal oxide; and
    wherein the insulator stack portion further comprises a metal silicate layer between the first dielectric and the dielectric stack.

22. The structure of claim 20, wherein the first interconnect is recessed relative to a top surface of the first dielectric.

* * * * *